United States Patent
Metz et al.

(10) Patent No.: US 7,060,568 B2
(45) Date of Patent: Jun. 13, 2006

(54) USING DIFFERENT GATE DIELECTRICS WITH NMOS AND PMOS TRANSISTORS OF A COMPLEMENTARY METAL OXIDE SEMICONDUCTOR INTEGRATED CIRCUIT

(75) Inventors: Matthew V. Metz, Hillsboro, OR (US); Suman Datta, Beaverton, OR (US); Jack Kavalieros, Portland, OR (US); Mark L. Doczy, Beaverton, OR (US); Justin K. Brask, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/881,055

(22) Filed: Jun. 30, 2004

(65) Prior Publication Data

US 2006/0001106 A1 Jan. 5, 2006

(51) Int. Cl.
*H01L 21/8234* (2006.01)
*H01L 21/336* (2006.01)
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 438/275; 438/279; 257/369; 257/390; 257/407

(58) Field of Classification Search ............ 438/659, 438/608, 162, 275, 279, 528; 257/407, 369, 257/390, 4
See application file for complete search history.

(56) References Cited

U.S. PATENT DOCUMENTS

| 3,903,542 | A | * | 9/1975 | Nathanson et al. | 257/212 |
|---|---|---|---|---|---|
| 5,970,331 | A | | 10/1999 | Gardner et al. | |
| 6,080,682 | A | * | 6/2000 | Ibok | 438/770 |
| 6,165,849 | A | * | 12/2000 | An et al. | 438/275 |
| 6,171,910 | B1 | | 1/2001 | Hobbs et al. | |
| 6,228,721 | B1 | | 5/2001 | Yu | |
| 6,303,418 | B1 | * | 10/2001 | Cha et al. | 438/199 |
| 6,376,888 | B1 | * | 4/2002 | Tsunashima et al. | 257/407 |
| 6,423,647 | B1 | | 7/2002 | Yu | |
| 6,458,695 | B1 | * | 10/2002 | Lin et al. | 438/659 |
| 6,563,183 | B1 | | 5/2003 | En et al. | |
| 6,661,061 | B1 | * | 12/2003 | Gardner et al. | 257/369 |
| 6,872,627 | B1 | * | 3/2005 | Chen et al. | 438/303 |
| 2002/0028554 | A1 | | 3/2002 | Bronner et al. | |
| 2002/0072168 | A1 | * | 6/2002 | Tseng | 438/231 |
| 2002/0135030 | A1 | | 9/2002 | Horikawa | |
| 2003/0119292 | A1 | | 6/2003 | Lee et al. | |
| 2003/0219953 | A1 | | 11/2003 | Mayuzumi | |
| 2004/0121541 | A1 | | 6/2004 | Doczy et al. | |
| 2005/0167761 | A1 | | 8/2005 | Watanabe | |

FOREIGN PATENT DOCUMENTS

| EP | 1 388 889 | 2/2004 |
|---|---|---|
| WO | WO 03/088357 | 10/2003 |

* cited by examiner

*Primary Examiner*—Donghee Kang
*Assistant Examiner*—Samuel A. Gebremariam
(74) *Attorney, Agent, or Firm*—Trop, Pruner & Hu, P.C.

(57) ABSTRACT

Complementary metal oxide semiconductor integrated circuits may be formed with NMOS and PMOS transistors having different gate dielectrics. The different gate dielectrics may be formed, for example, by a replacement process. The gate dielectrics may differ in material, thickness, or formation techniques, as a few examples.

12 Claims, 3 Drawing Sheets

USING DIFFERENT GATE DIELECTRICS WITH NMOS AND PMOS TRANSISTORS OF A COMPLEMENTARY METAL OXIDE SEMICONDUCTOR INTEGRATED CIRCUIT

BACKGROUND

This invention relates generally to semiconductor technology, semiconductor processing, and the formation of complementary metal oxide semiconductor integrated circuits.

Complementary metal oxide semiconductor integrated circuits include NMOS transistors and PMOS transistors. Generally, these transistors may be made by forming a gate dielectric and then forming NMOS and PMOS gate structures on top of that dielectric. The gate electrode structures may be made of polysilicon, silicide, or metal.

A dummy gate electrode, such as a polysilicon gate electrode, may also be formed over a gate dielectric. Then the dummy gate electrode may be removed and replaced with a metal gate electrode. In such a process, different metal gate electrodes may be utilized for the NMOS and PMOS transistors, but a common dielectric is utilized.

Thus, there is a need for complementary metal oxide semiconductor fabrication techniques.

DETAILED DESCRIPTION

Complementary metal oxide semiconductor (CMOS) integrated circuits may be fabricated with NMOS and PMOS transistors having different gate dielectrics. The dielectrics may be different in terms of the materials used, their thicknesses, or the techniques used to form the gate dielectrics, to mention a few examples. As a result, the gate dielectric can be tailored to the particular type of transistor, be it an NMOS or PMOS transistor, as the case may be.

Figure 1:
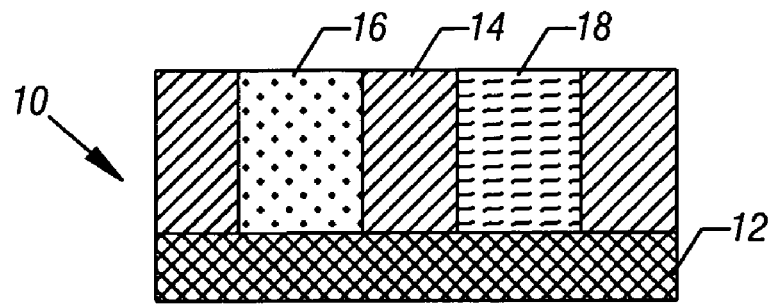
FIG. 1 is an enlarged, partial, cross-sectional view of one embodiment of the present invention at an early stage of manufacture.

Referring to FIG. 1, in accordance with one embodiment of the present invention, an initial semiconductor structure 10 includes a semiconductor substrate 12 having an insulator 14 formed thereon with trenches filled by dummy gate materials 16 and 18. The dummy gate materials 16 and 18, in one embodiment, may be doped polysilicon, for example.

Figure 2:
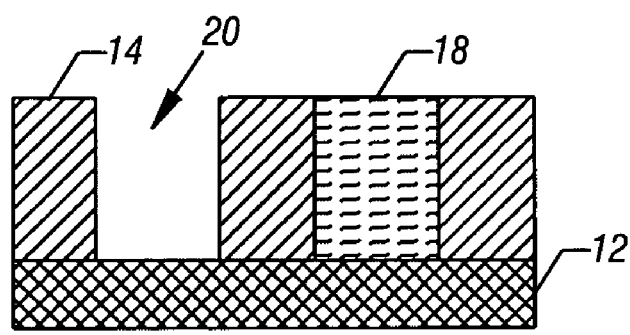
FIG. 2 is an enlarged, partial, cross-sectional view of the embodiment shown in FIG. 1 at a subsequent stage of manufacture in accordance with one embodiment of the present invention.

Referring to FIG. 2, the dummy gate material 16 has been removed. The removal of the dummy gate material 16 may be accomplished by masking, etch-out, or other methods. In an etch-out process, the material 16 may be selectively etched relative to the material 18. Thus, in one embodiment, the materials 16 and 18 may be different materials such that one may be etched selectively relative to the other. If an etchant, such as a wet etchant, is utilized which preferentially attacks the material 16, the material 16 can be selectively etched while the material 18 remains.

For example, in accordance with one embodiment of the present invention, the material 16 may be an N-doped polysilicon, while the material 18 is a P-doped polysilicon. An etchant such as tetramethylammonium hydroxide (TMAH) or $NH_4OH$, together with sonication, may be utilized to selectively etch one of the materials 16 or 18, while not significantly etching the other material. Depending on the choice of wet etchant utilized to etch the material 16 or 18, one of the dummy gate materials 16 and 18 can be etched while the other one is substantially unetched. Then the other or remaining gate material 16 or 18 may be removed.

Figure 3:
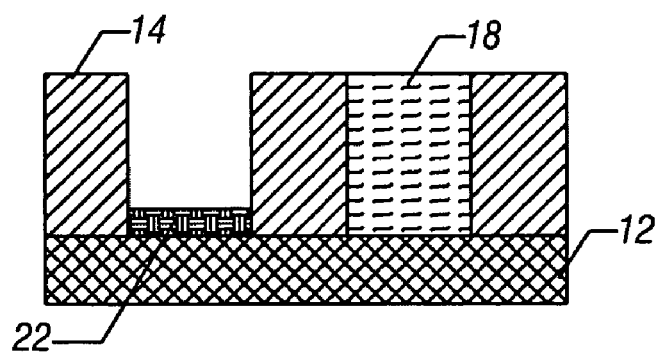
FIG. 3 is an enlarged, partial, cross-sectional view of the embodiment shown in FIG. 2 at a subsequent stage of manufacture in accordance with one embodiment of the present invention.

Referring to FIG. 3, in accordance with one embodiment of the present invention, a dielectric 22 may be formed on the substrate 12 in the opening 20 creating by the removal of the gate material 16. In one embodiment, the dielectric 22 can be selected to have characteristics to optimize the performance of either an NMOS or PMOS transistor to be formed in the region 20. For example, the gate dielectric 22 material, thickness or formation technique may be tailored for its particular application.

For example, the NMOS transistor may use a larger conduction band offset material, such as silicon dioxide, and the PMOS transistor may use a material with a higher dielectric constant, such as hafnium dioxide, which also happens to have good band offset for holes. Higher dielectric constants may be greater than ten in one embodiment. As another example, a thicker material may be utilized for the NMOS than the PMOS transistors in some cases. For example, hafnium dioxide leaks electrons more than holes, so a thicker hafnium dioxide layer may be utilized on the NMOS transistors and a thinner hafnium dioxide layer may be utilized on the PMOS transistors. For example, in one embodiment, the hafnium dioxide gate dielectric may be 30 Angstroms for the NMOS transistors and 15 Angstroms for the gate dielectric for PMOS transistors.

As still another example, the deposition techniques may be different for the two gate dielectrics. For example, materials for the NMOS transistor, such as silicon dioxide, may be deposited using diffusion techniques, while atomic layer deposition, sputtering, or metal organic chemical vapor deposition (MOCVD) may be utilized to deposit high dielectric constant materials such as hafnium dioxide.

One gate dielectric may be a high-k material (having a dielectric constant greater than 10) and the other may be a low-k material (having a dielectric constant less than 10). Alternatively, both dielectrics may be high-k or both may be low-k dielectrics.

The appropriate gate electrode material 24 may then be deposited over the gate dielectric 22 in the opening 20 created by the removal of the material 16.

Figure 4:
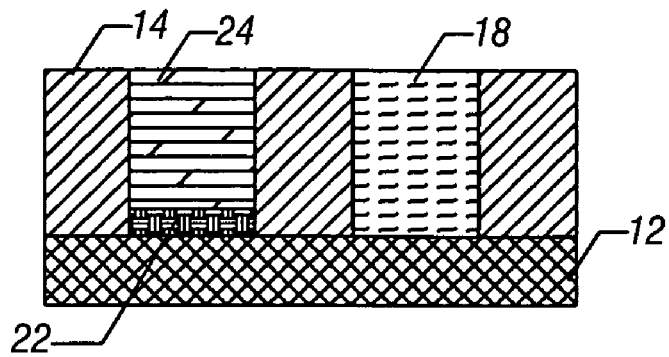
FIG. 4 is a partial, enlarged, cross-sectional view of the embodiment shown in FIG. 3 at a subsequent stage of manufacture in accordance with one embodiment of the present invention.

Referring to FIG. 4, a gate electrode material 24 may be deposited over the gate dielectric 22. The material 24 may be any conductive material, including doped polysilicon or metal. The material may be deposited using any suitable technique.

Figure 5:
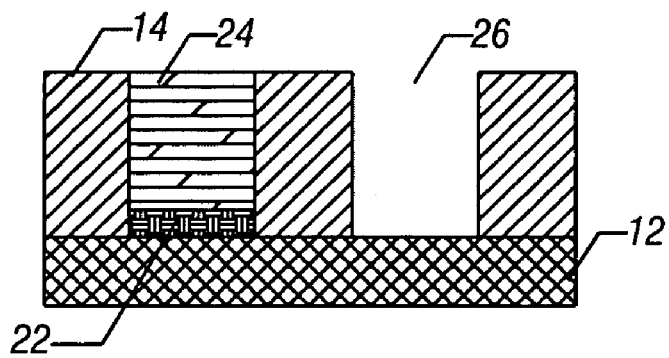
FIG. 5 is an enlarged, partial, cross-sectional view of the embodiment shown in FIG. 4 at a subsequent stage of manufacture in accordance with one embodiment of the present invention.

Referring to FIG. 5, the gate material 18 may be selectively removed. The selective removal may again be accomplished using selective etching, masking, or any other method to remove the material 18, while leaving the material 24.

Figure 6:
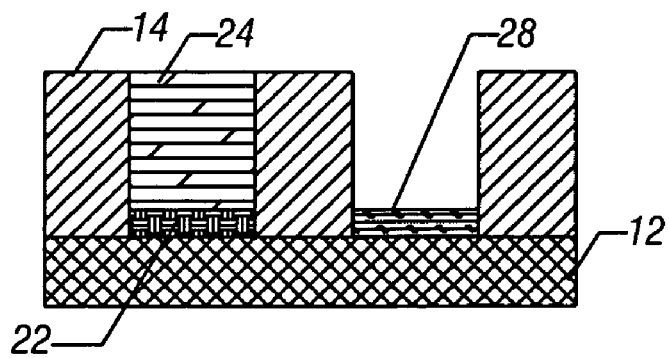
FIG. 6 is a partial, enlarged, cross-sectional view of the embodiment shown in FIG. 5 at a subsequent stage of manufacture in accordance with one embodiment of the present invention.

Then, as shown in FIG. 6, a gate dielectric 28 may be formed in the opening 26 created by the removal of the material 18. Again, the characteristics of the gate dielectric 28 may be optimized for its particular application, be it for a PMOS or an NMOS transistor. For example, its thickness, formation technique, or the material utilized may be selected to optimize the performance of the ultimate transistor.

In some embodiments of the present invention, it may be desirable to ensure that the material 18 is selectively etchable relative to the material 24. For example, selective etching may be based on the fact that the materials 18 and 24 are of a different material type.

Figure 7:
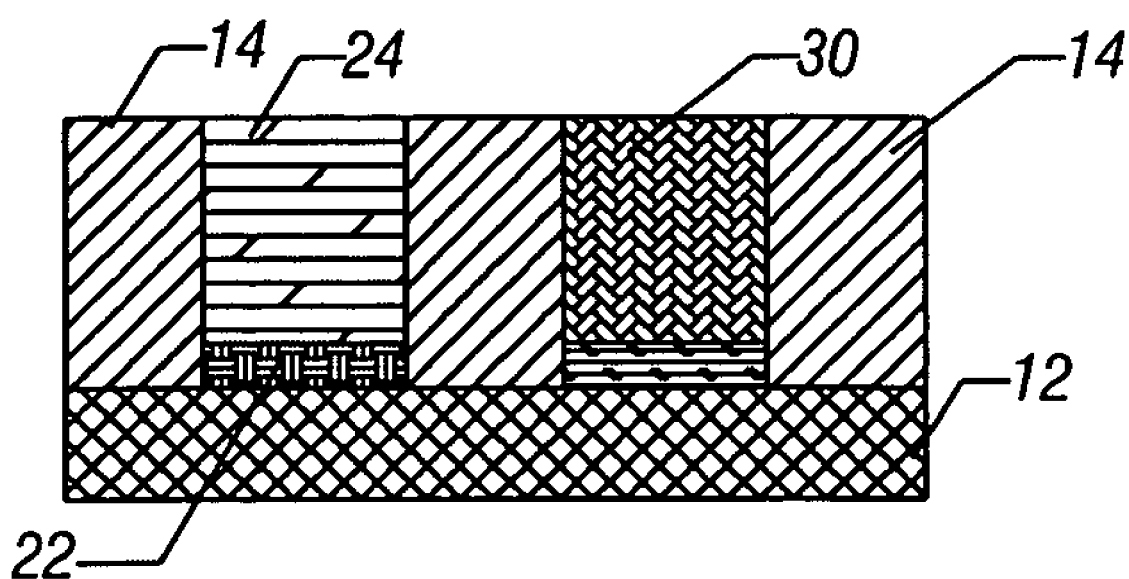
FIG. 7 is a partial, enlarged, cross-sectional view of the embodiment shown in FIG. 6 at a subsequent stage of manufacture in accordance with one embodiment of the present invention.

Referring to FIG. 7, an appropriate gate electrode material 30 may then be formed in the opening 26 over the gate dielectric 28. In some embodiments, the gate materials 24 and 30 may be doped polysilicon, may include silicide, or may be a metal.

In some embodiments, a single gate dielectric material may not provide the highest performance for both NMOS and PMOS structures. This may be due, for example, to poor band offset with conduction or valence bonds, incompatibility to the gate electrode material, incompatibility with gate electrode processing or thickness requirements. By selecting the better candidate dielectric film for each structure, and depositing the best film with the optimal thickness, higher performance complementary metal oxide semiconductor devices may be created in some embodiments. By using better gate dielectric material of optimal thickness for each electrode stack, higher performance structures may be created that may exhibit higher mobility, higher saturation current, or better threshold voltage in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A method comprising:
   filling a first trench with a first material and a second trench with a second material different from the first material;
   selectively etching the first material in the first trench to remove said first material;
   forming a gate dielectric in said first trench while said second trench remains filled with said second material; and
   forming a gate electrode over said dielectric in said first trench.

2. The method of claim 1 including forming transistors having different gate dielectrics.

3. The method of claim 1 including forming transistors having different gate dielectrics.

4. The method of claim 3 wherein forming transistors having different gate dielectrics includes forming transistors having gate dielectrics deposited by different techniques.

5. The method of claim 1 including forming NMOS and PMOS transistors with metal gates.

6. The method of claim 5 including using NMOS gate dielectric material with a larger conduction band offset.

7. The method of claim 6 including using a PMOS gate dielectric with a higher dielectric constant than the NMOS gate dielectric.

8. The method of claim 7 including using a thicker gate dielectric for said NMOS transistor than for said PMOS transistor.

9. The method of claim 8 including using a gate dielectric switch dielectric constants greater than 10 as the gate dielectrics of said NMOS and PMOS transistors.

10. The method of claim 7 including using silicon dioxide for said gate dielectric for said NMOS transistor and using a material having a dielectric constant greater than that of silicon dioxide for said PMOS transistor.

11. The method of claim 10 including depositing said dielectric for said NMOS transistor using diffusion.

12. The method of claim 10 including forming the dielectric, for said PMOS transistor using one of atomic layer deposition, metal organic chemical vapor deposition, or sputter deposition.

* * * * *

UNITED STATES PATENT AND TRADEMARK OFFICE
CERTIFICATE OF CORRECTION

| | | |
|---|---|---|
| PATENT NO. | : 7,060,568 B2 | Page 1 of 1 |
| APPLICATION NO. | : 10/881055 | |
| DATED | : June 13, 2006 | |
| INVENTOR(S) | : Matthew V. Metz et al. | |

It is certified that error appears in the above-identified patent and that said Letters Patent is hereby corrected as shown below:

<u>Column 4:</u>
Line 24, delete "material".

Signed and Sealed this

Nineteenth Day of September, 2006

JON W. DUDAS
*Director of the United States Patent and Trademark Office*